United States Patent [19]
Tatsumi

[11] Patent Number: 5,959,925
[45] Date of Patent: Sep. 28, 1999

[54] DRAM INCORPORATING SELF REFRESH CONTROL CIRCUIT AND SYSTEM LSI INCLUDING THE DRAM

[75] Inventor: Takashi Tatsumi, Tokyo, Japan

[73] Assignee: Mitsubishi Denki Kabushiki Kaisha, Tokyo, Japan

[21] Appl. No.: 09/184,646

[22] Filed: Nov. 3, 1998

[30] Foreign Application Priority Data

Jun. 1, 1998 [JP] Japan .................................. 10-151703

[51] Int. Cl.[6] .................................................... G11C 7/00
[52] U.S. Cl. ............... 365/222; 365/189.05; 365/230.06; 365/230.08; 365/236
[58] Field of Search ............................. 365/222, 189.05, 365/230.06, 230.08, 236

[56] References Cited

U.S. PATENT DOCUMENTS

| | | | |
|---|---|---|---|
| 4,943,960 | 7/1990 | Komatsu et al. | 365/222 |
| 5,295,109 | 3/1994 | Nawaki | 365/222 |
| 5,299,168 | 3/1994 | Kang | 365/222 |
| 5,321,662 | 6/1994 | Ogawa | 365/222 |
| 5,335,202 | 8/1994 | Manning et al. | 365/222 |
| 5,343,430 | 8/1994 | Furuyama | 365/222 |
| 5,475,646 | 12/1995 | Ogihara | 365/222 |
| 5,502,677 | 3/1996 | Takahashi | 365/222 |
| 5,532,968 | 7/1996 | Lee | 365/222 |
| 5,818,777 | 10/1998 | Seyyedy | 365/222 |

FOREIGN PATENT DOCUMENTS

8/315569  11/1996  Japan .

*Primary Examiner*—Trong Phan
*Attorney, Agent, or Firm*—Burns, Doane, Swecker & Mathis, LLP

[57] ABSTRACT

A DRAM and a system LSI incorporating the DRAM. The DRAM has a self refresh address control section (11) inputs a control signal to optionally specify a period of a self refresh operation for the DRAM, a self refresh control circuit (7,71) for specifying the period of an address signal to be used for the self refresh operation and for outputting a self cycle signal, and a row address buffer (8) for providing addresses to the memory cell array (10) based on the self cycle signal as a trigger signal.

14 Claims, 7 Drawing Sheets

DRAM INCORPORATING SELF REFRESH CONTROL CIRCUIT AND SYSTEM LSI INCLUDING THE DRAM

BACKGROUND OF THE INVENTION

1. Field of the Invention

The present invention relates to a Dynamic Random Access Memory incorporating a self refresh control circuit for performing a self refresh operation for a plurality of memory cells in a memory cell array in the DRAM, and, more particularly, to a DRAM having a self refresh control circuit capable of easily changing the period of the self refresh operation with a desired period and thereby reducing a power consumption of the DRAM during a stand-by state.

2. Description of the Prior Art

In conventional DRAM devices, one has been disclosed in U.S. Pat. No. 5,321,662, for example, a period (or a cycle) of a self refresh operation (or a self refreshing) is fixed, not changed by a programmable method, and it is also difficult to detect the period of the self refresh by external devices. Accordingly, in the conventional DRAM devices, it is difficult to perform the self refresh at an optimum period. This causes an increase in the power consumption of the DRAM devices. In particular, there is a drawback that the power consumption of a DRAM device not having an optimum period or cycle of the self refresh operation is larger when compared with a DRAM device having the optimum period of the self refresh operation.

In addition, in the conventional DRAM devices described above, because it is difficult to change the period of the self refresh operation according to demand, there is a drawback that it is difficult to perform the operation test for the DRAM devices by using various periods in the self refresh operation.

As described above, since the conventional DRAM devices have fixed periods of the self refresh, that is, it is thereby difficult to change the period of the self refresh operation for the DRAM devices by a programmable method according to need, and it is also difficult to currently detect the period of the self refresh, so that it is difficult to set the optimum period of the self refresh operation for each DRAM device, and so that it is thereby difficult to make a DRAM of a low power consumption. Furthermore, in the past, it is also difficult to perform the operation test for each DRAM device by changing the period of the self refresh operation to a desired period.

SUMMARY OF THE INVENTION

Accordingly, an object of the present invention is, with due consideration to the drawbacks of the conventional DRAM, to provide a DRAM and a system LSI incorporating this DRAM. The DRAM has a self refresh control circuit capable of easily changing the period of the self refresh operation to a desired period and capable of performing the self refresh operation for the DRAM at the optimum period, and capable of reducing the power consumption of the DRAM, and capable of easily performing the operation test for the DRAM.

In accordance with a preferred embodiment of the present invention, a dynamic random access memory incorporating a self refresh control circuit comprises a memory cell array comprising a plurality of memory cells, and a self refresh address control section for setting a period of a self refresh operation for the memory cell array having the plurality of memory cells and for providing an address signal to the memory cell array in order to performing the self refresh operation for the memory cell array. The self refresh address control section comprises a self refresh control circuit for inputting a control signal to optionally set a period of the self refresh operation and for setting a period of an address signal of the self refresh operation based on the received control signal, and for outputting a self cycle signal of the period that has been set, and a row address buffer for inputting the self cycle signal that has been set by the self refresh control circuit, and for outputting the address signal to the memory cell array based on the self cycle signal as a trigger signal.

In the dynamic random access memory incorporating the self refresh control circuit as another preferred embodiment according to the present invention, the self refresh control circuit comprises a refresh control register and a self refresh period counter. The self refresh control register inputs a control signal to optionally specify a period of the self refresh operation for the memory cell array, outputs a magnification control signal indicating the period of the address signal for the self refresh operation based on the control signal to optionally specify the period of the self refresh operation, and the self refresh period counter inputs the magnification control signal, generates a self cycle signal, and outputs the generated self cycle signal to the row address buffer.

In the dynamic random access memory incorporating the self refresh control circuit as another preferred embodiment according to the present invention, the self refresh control circuit comprises a decoder and a self refresh period counter. The decoder inputs a control signal to optionally specify a period of the self refresh operation, decodes the control signal in order to generate and output a magnification control signal indicating the period of the self refresh operation based on the control signal in order to optionally specify the period of the self refresh operation. The self refresh period counter inputs the magnification control signal, generates a self cycle signal, and outputs the generated self cycle signal to the row address buffer.

The dynamic random access memory incorporating the self refresh control circuit as another preferred embodiment according to the present invention, the self refresh control circuit further comprises a self cycle control pin in order to provide the self cycle signal, to be transferred from the self refresh control circuit to the row address buffer, into external devices, and the self cycle signal is transferred to the external devices through the self cycle control pin in order to control the period of the self refresh operation.

The dynamic random access memory incorporating a self refresh control circuit as another preferred embodiment according to the present invention further comprises a read/write control circuit for transferring an enable signal to both the column decoder and the data output buffer during the self refresh operation in order to operate the column decoder and the data output buffer, and data items stored in the memory cell array are transferred to external devices based on the period of the self refresh operation that has been set by the self refresh control circuit.

In accordance with another preferred embodiment, a system LSI comprises the dynamic random access memory of the present invention, and a system for inputting data items from the DRAM and outputting data items to the DRAM, and processing the data items.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Figure 1:
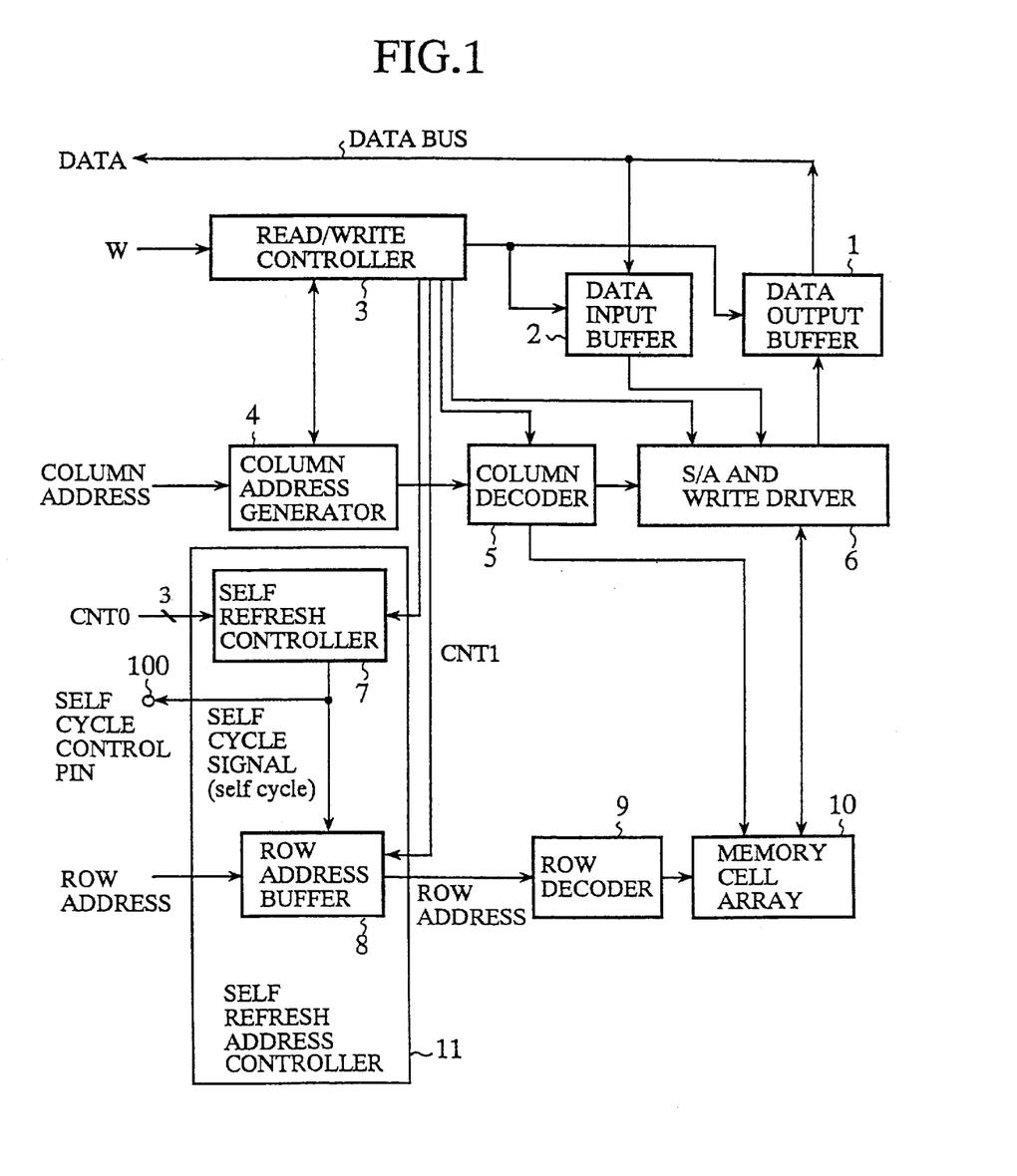
FIG. 1 is a block diagram showing a configuration of a DRAM having a self refresh control circuit as the first embodiment according to the present invention.

Other features of this invention will become apparent through the following description of preferred embodiments which are given for illustration of the invention and are not intended to be limiting thereof. The preferred embodiments of a DRAM having a self refresh control circuit and a system LSI including the DRAM according to the present invention will now be described with reference to the drawings.
First embodiment FIG. 1 is a block diagram showing a configuration of a DRAM having a self refresh control circuit as the first embodiment according to the present invention. In FIG. 1, the reference number 10 designates a memory cell array comprising a plurality of memory cells into which and from which data items are input and output. The reference number 1 denotes a data output buffer for temporarily storing data items that are stored in the memory cell array 10 in order to be transferred to external devices (omitted from FIG. 1), and the reference number 2 indicates a data input buffer for temporarily storing data items to be transferred to the memory cell array 10. The reference number 3 designates a read/write control circuit, the reference number 4 denotes a column address generation circuit for generating a column address for the memory cells in the memory cell array 10, and the reference number 5 indicates a column decoder for inputting a column address transferred from the column address generation circuit 4 and for decoding it. The reference number 6 designates a sense amplifier and a write driver, the reference number 7 denotes a self refresh control circuit, the reference number 8 indicates a row address buffer, and the reference number 9 designates a row decoder. The reference number 11 designates a self refresh address control section, incorporating the self refresh control circuit 7 and the row address buffer 8, for generating addresses to be used for the self refresh operation and for outputting the addresses.

Thus, the DRAM according to the first embodiment comprises the memory cell array 10, the self refresh address control section 11, and other circuit components. This self refresh address control section 11 has the self refresh control circuit 7 for controlling the period of the self refresh operation for the memory cell array 10.

Figure 2:
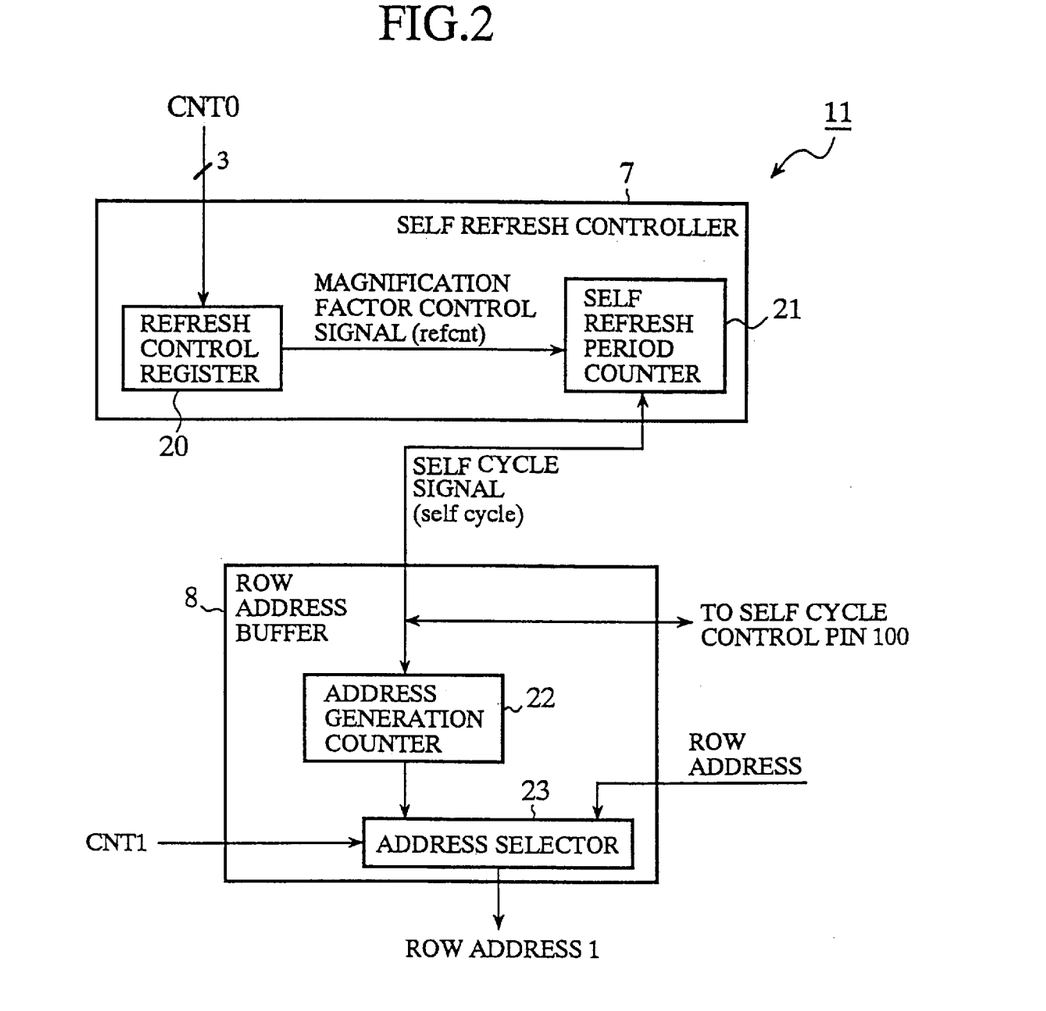
FIG. 2 is a block diagram showing a configuration of a self refresh address control section incorporated in the DRAM as the first embodiment shown in FIG. 1.

FIG. 2 is a block diagram showing the detailed configuration of the self refresh address control section 11 incorporated in the DRAM as the first embodiment shown in FIG. 1. In FIG. 2, the reference number 20 designates a refresh control register, and the reference number 21 denotes a self refresh period counter having a fuse circuit to be used for adjusting the self refresh period. The reference number 22 designates an address generation counter, and the reference number 23 denotes an address selector. Thus, the self refresh control circuit 7 comprises the refresh control register 20 and the self refresh period counter 21. The row address buffer 8 comprises the address generation counter 22 and the address selector 23.

Figure 3:
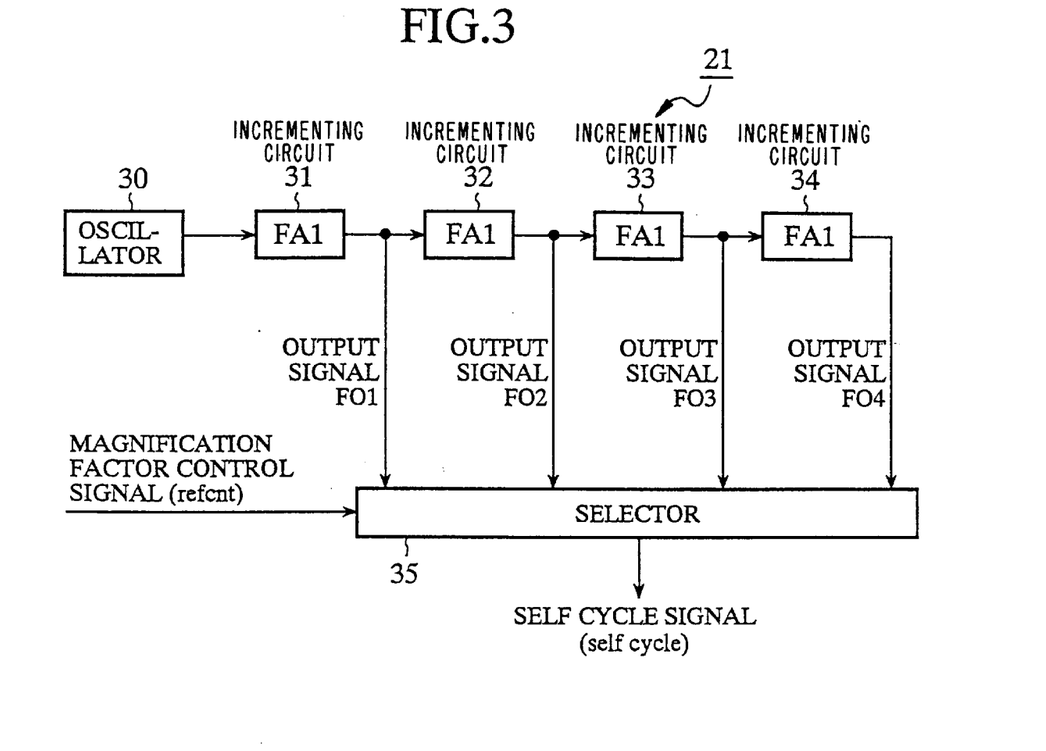
FIG. 3 is a block diagram showing a configuration of a self refresh period counter.

FIG. 3 is a block diagram showing the detailed configuration of the self refresh period counter 21 incorporated in the self refresh control circuit 7. In FIG. 3, the reference number 30 designates an oscillation circuit for oscillating and outputting clock signals having a predetermined frequency value, and the reference numbers 31 to 34 denote incrementing circuits FA1 to FA4, each of them is the incrementing circuit of one bit, namely, a counter. The reference number 35 designates a selector.

The data output buffer 1, the data input buffer 2, the read/write control circuit 3, the column address generation circuit 4, and the column decoder 5 operate under the normal read/write accessing, and they stop their operation completely under the self refresh operation. However, the read/write control circuit 3 generates and transmits enable signals to both the column decoder 5 and the data output buffer 1 only under the operation of the self refresh operation in the testing mode for the DRAM.

Next, a description will be given of the operation of the DRAM as the first embodiment.

Figure 4:
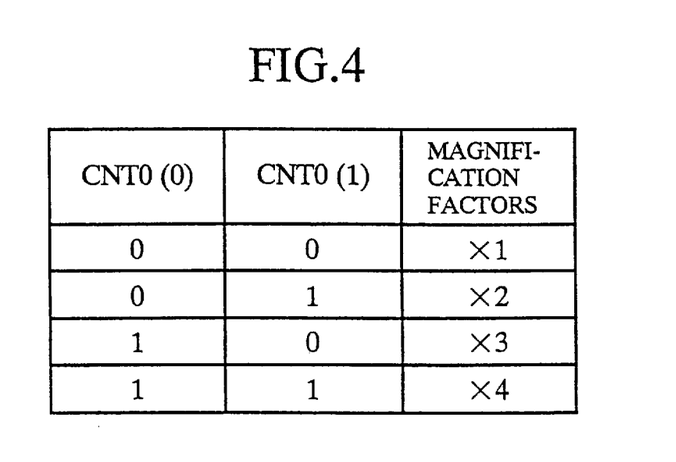
FIG. 4 is a diagram to explain magnification factors for the period of the self refresh to be selected by the self refresh period counter shown in FIG. 3 in the self refresh control circuit incorporated in the DRAM according to the first embodiment.

FIG. 4 is a diagram to explain magnification factors for the period of the self refresh operation to be selected by the self refresh period counter shown in FIG. 3. As shown in FIG. 4, external devices (omitted from the drawings), for example, when a control signal of three bits CNT0(0), CNT0(1), and CNT0(2) transmitted from a CPU (also omitted from the drawings) is written into the refresh control register 20, one of the magnification factors, ×1, ×2, ×3, and ×4 shown in FIG. 4 is written into the refresh control register 20 according to the magnification factor CNT0. Next, a magnification factor control signal refcnt is outputted from the refresh control register 20 to the self refresh period counter 21 based on the magnification factor that has been set in the refresh control register 20.

The signal CNT0(2) is a control signal to be used for setting whether the self refresh period becomes valid (effective) or not. In the DRAM of the first embodiment, when CNT0(0)=1, CNT0(1)=1, CNT0(2)=1, the value stored in the refresh control register 20 becomes valid (effective), so that the value of the magnification control signal refcnt from the refresh control register 20 becomes ×2. When CNT0(0)=1, CNT0(1)=1, CNT0(2)=0, the value stored in the refresh control register 20 becomes invalid, so that the DRAM operates under the normal refresh period.

The oscillation circuit 30 in the self refresh counter 21 is an oscillator for oscillating a signal whose period is 10 msec, for example.

Figure 5:
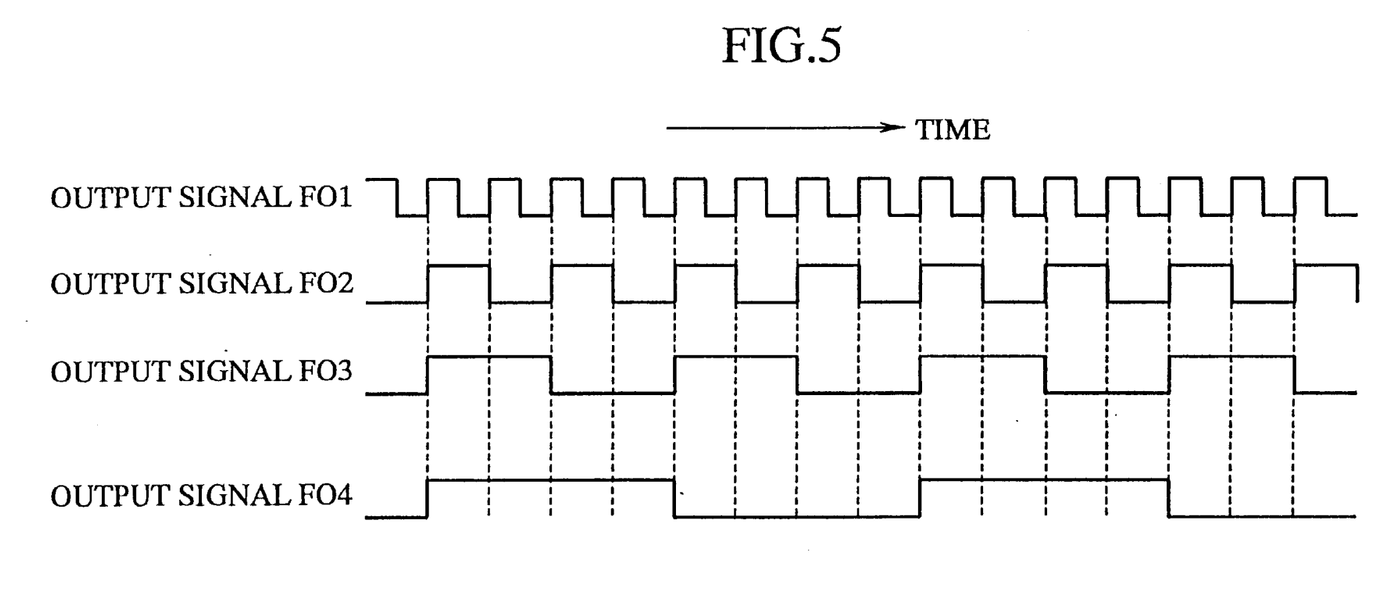
FIG. 5 is a timing chart showing the operation of the self refresh period counter shown in FIG. 3 in the self refresh control circuit incorporated in the DRAM according to the first embodiment.

FIG. 5 is a timing chart showing the operation of the self refresh period counter 21 in the self refresh control circuit 7 incorporated in the DRAM according to the first embodiment.

In the self refresh period counter 21 shown in FIG. 5, an oscillation output signal, whose period is 10 msec, transferred from the oscillation circuit 30 is provided to the incrementing circuits (FA1, FA2, FA3, and FA4) 31 to 34, each is a one bit counter, in order to count it up. For example, the period of the output signal provided from each of the incrementing circuits (FA1 to FA4) 31 to 34 is FO1, FO2, FO3, and FO4, respectively. The output signal FO1 has the period of 10 msec, the output signal FO2 has the period of 20 msec, the output signal FO3 has the period of 40 msec, and the output signal FO4 has the period of 80 msec.

The selector 35 inputs the magnification factor control signal refcnt transferred from the refresh control register 20 and then selects one of the output signals FO1 to FO4 provided from the incrementing circuits (FA1 to FA4) 31 to 34 of one bit based on the received magnification factor control signal refcnt.

When the magnification control signal refcnt is ×1 (refcnt=×1), the selector 35 selects the output signal FO1, when the magnification control signal refcnt is ×2 (refcnt=× 2), the selector 35 selects the output signal FO2, when the magnification control signal refcnt is ×3 (refcnt=×3), the selector 35 selects the output signal FO3, and when the magnification control signal refcnt is ×4 (refcnt=×4), the selector 35 selects the output signal FO4.

In the explanation described above, because the magnification control signal refcnt indicates the magnification of ×2, the selector 35 selects the output signal FO2, so that the selector 35 outputs the self cycle signal (self cycle) of the period of 20 msec to the address generation counter 22. In addition, this self cycle signal (self cycle) is also provided to external devices (omitted from the drawings) through the self cycle control pin 100. Thus, it is possible to easily detect the period of the self refresh operation externally, because this self cycle signal (self cycle) may be transferred to external devices through the self cycle control pin 100.

When the value of the control signal CNT1 transferred from the read/write control circuit 3 is 1 (CNT1=1) during the normal read/write operation mode, the row address buffer 8 in the self refresh address control section 11 selects the row address provided from the read/write control circuit 3, and outputs the selected row address into the row decoder 9 connected to the memory cell array 10.

On the other hand, when the control signal CNT1 is 0 (CNT1=0) during a self refresh operation mode executing the self refresh operation, the address generation counter 22 in the row address buffer 8 performs the incrementing operation according to the self cycle signal (self cycle) of the period of 20 msec provided from the self refresh control circuit 7 as a trigger signal, and then the address selector 23 selects the address generated by the address generation counter 22 and outputs the selected address into the row decoder 9.

In the DRAM according to the first embodiment, during the self refresh mode, namely when the control signal CNT1 is zero (CNT1=0), the address generated by the address generation counter 22 is output to the row decoder 9. The row decoder 9 receives this row address from the row address buffer 8 and decodes the received row address. Thereby, the memory cell in the memory cell array 10 corresponding to the decoded address is accessed. The data stored in the accessed memory cell is amplified by the sense amplifier in the sense amplifier/write driver 6 and also written into the same memory cell again. The self refresh operation for the memory cell is thereby completed. The same operation is also performed for each of all memory cells, repeatedly. During the test operation mode, the accessed data stored in each memory cell is provided into the data bus through the data output buffer 1.

In addition, when the self refresh is performed during the test operation mode in the DRAM having the self refresh control circuit of the first embodiment, the read/write control circuit 3 transmits an enable signal into both the column decoder 5 and the data output buffer 1. Thereby, the external device (omitted from the drawings) reads data from the data output buffer 1 and detects the period of the self refresh operation based on the period of the data in order to set an optimum period of the self refresh operation.

Although the setting of the self refresh period for the self refresh control register 20 in the DRAM as the first embodiment has been explained, it is possible to set the optimum period of the self refresh for the DRAM during the normal operation mode by melting and cutting fuses in a fuse circuit (omitted from the drawings) incorporated in the self refresh period counter 21 by using a laser beam, for example, after the optimum period has been detected during the test mode.

The concept of the present invention is not limited by the operation to set the optimum period of the self refresh operation for DRAM devices described above, for example, it is also possible to apply an auto refresh operation for Column Before Refresh (CBR) operation.

In addition, in the explanation of the first embodiment described above, although the self cycle signal (self cycle) is generated by re-writing the data stored in the refresh control register 20 with a new value based on the control signal CNT0 inputted by the self refresh control circuit 7, the present invention is not limited by this, for example, it is possible to change the period of the self refresh operation based on the self cycle signal (self cycle), transferred from external devices (not shown), received by the row address buffer 8 through the self cycle control pin 100.

Figure 8:
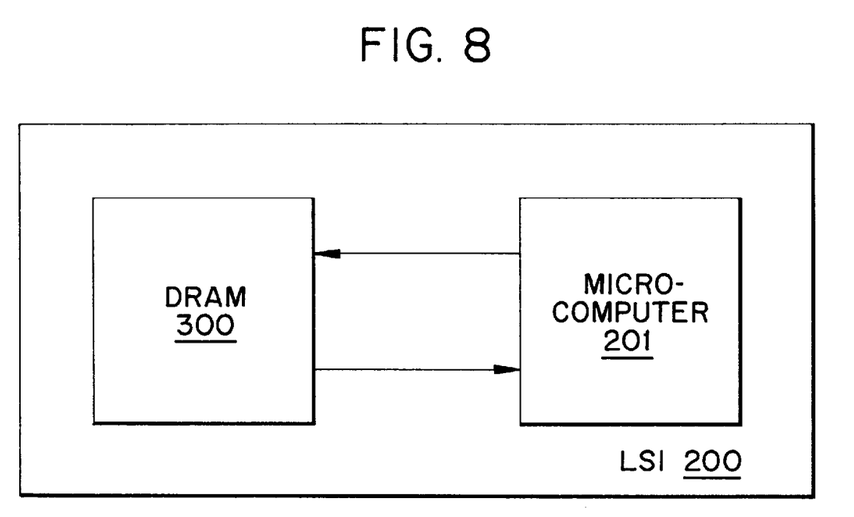
FIG. 8 is a block diagram showing a system LSI according to an embodiment of the present invention.

Furthermore, in the explanation of the first embodiment described above, only the single DRAM is used as a memory, but the present invention is not limited by this configuration, it is also possible to apply the concept of the present invention to a system LSI 200 in which a microcomputer 201 and a DRAM 300 are combined (FIG. 8) or a ASIC device and a DRAM device or a plurality of DRAM devices are combined.

As described above, according to the first embodiment of the present invention, the self refresh control circuit 7 is incorporated in the self refresh address control section 11, and the control data CNT0 is written into the self refresh control register 20 in the self refresh control circuit 7 so that the self refresh operation may be performed easily, and the self refresh operation is performed in various periods. Because it is thereby possible to detect the states of the DRAM under the various periods of the self refresh through the self cycle control pin 100, it is possible to set the period of the self refresh operation into the optimum period.

In addition, because the optimum period is set for the DRAM, it is possible to reduce the power consumption of the DRAM. Furthermore, because the read/write control circuit 3 may set the column system including the column decoder 5 into a disable state during the self refresh operation, and also may set the column system into an enable state during the self refresh operation in the test mode, it is possible to reduce the power consumption of the DRAM during the self refresh operation to be performed in the normal operation mode.

Second embodiment

Next, the self refresh control circuit incorporated in a DRAM according to the second embodiment of the present invention will be explained.

Figure 6:
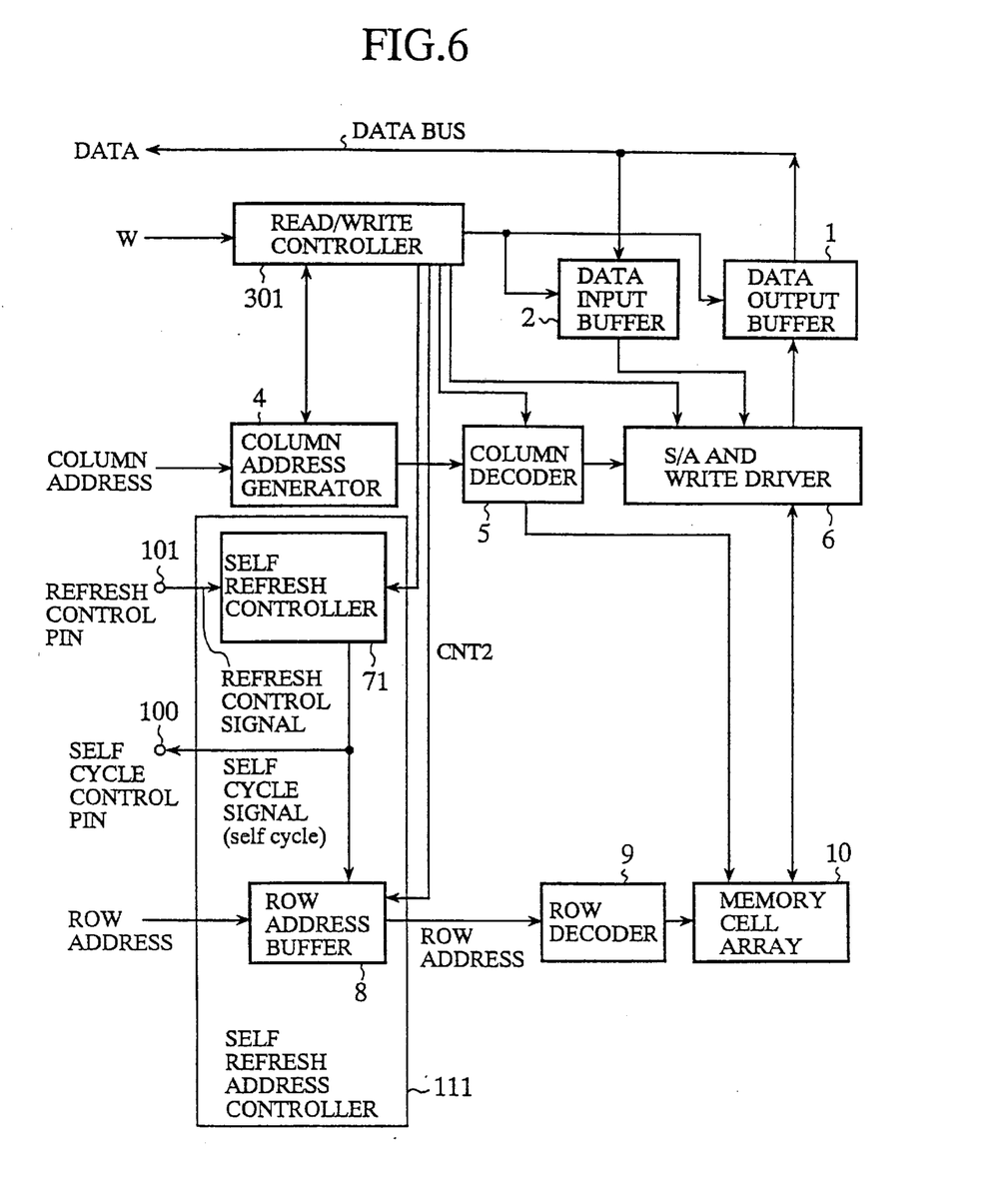
FIG. 6 is a block diagram showing a configuration of a DRAM having a self refresh control circuit as the second embodiment according to the present invention.

FIG. 6 is a block diagram showing a configuration of the DRAM having the self refresh control circuit as the second embodiment according to the present invention. In FIG. 6, the reference number 71 designates the self refresh control circuit, and the reference number 101 denotes a refresh control pin. The reference number 111 indicates a self refresh address control section, including a self refresh control circuit 71 and a row address buffer 8, for generating and outputting addresses to be used for the self refresh operation. The reference number 301 designates a read/write control circuit.

The data output buffer 1, the data input buffer 2, the read/write control circuit 301, the column address generation circuit 4, and the column decoder 5 operate during a read/write accessing mode, and they stop their operation completely during the self refresh operation. When the self refresh operation is executed during the test mode, the read/write control circuit 301 transfers the enable signal to both the column decoder 5 and the data output buffer 1.

Figure 7:
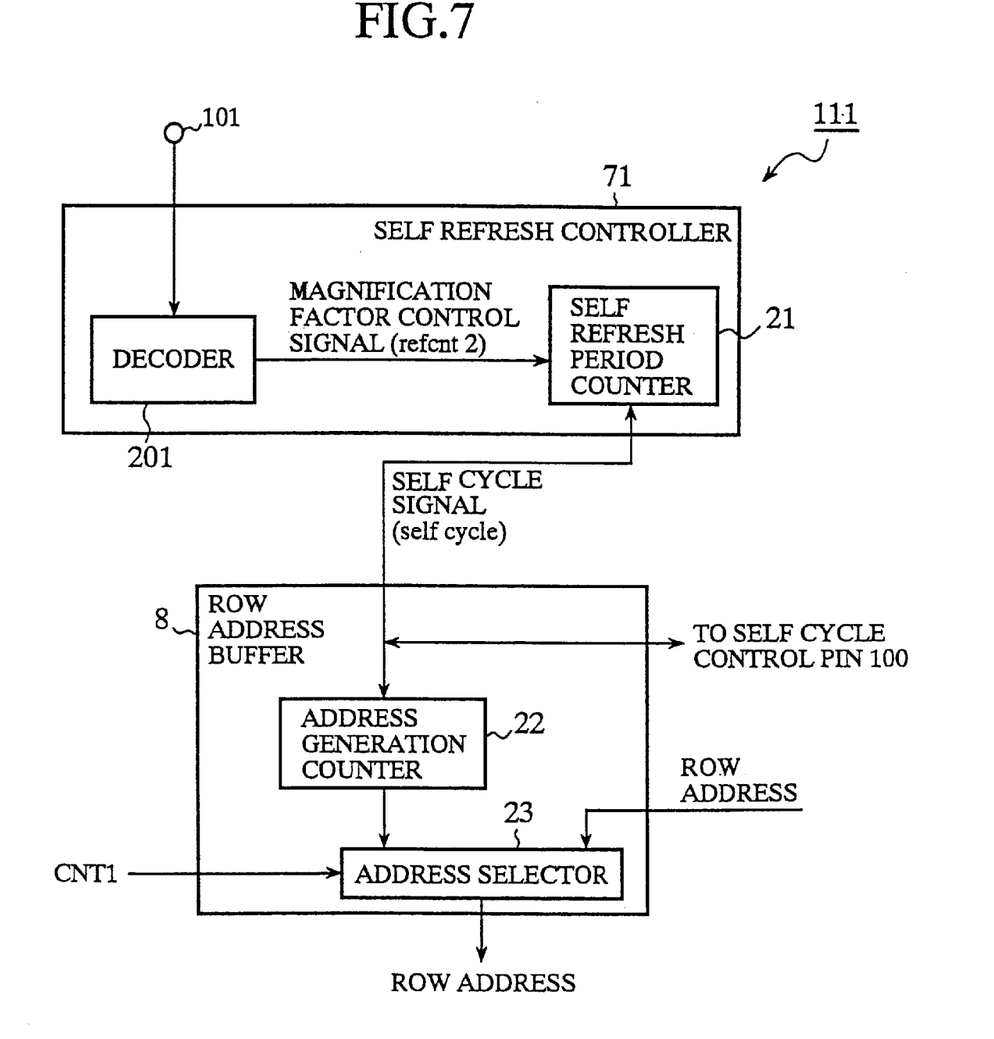
FIG. 7 is a block diagram showing the configuration of a self refresh address control section incorporated in the DRAM as the second embodiment shown in FIG. 6.

FIG. 7 is a block diagram showing the detailed configuration of the self refresh address control section 111 incorporated in the DRAM according to the second embodiment shown in FIG. 6. In FIG. 7, the reference number 201 designates a decoder. Other circuit components in the DRAM as the second embodiment are the same of them in the DRAM as the first embodiment shown in FIG. 1, the same reference numbers are used for the same circuit components, and the explanation of them is therefore omitted here for brevity.

The DRAM as the second embodiment incorporates the self refresh address control section 111 including the self refresh control circuit 71 for controlling the period of the self refresh operation for the memory cell array 10, in addition to the memory cell array 10, and other circuit components.

Next, a description will be given of the operation of the DRAM as the second embodiment, First, the setting of the magnification factors for the period of the self refresh operation will be explained.

The refresh control signal transferred from external devices (omitted from the drawings), such as a CPU, is written into the decoder 201 in the self refresh control circuit 71 through the refresh control pin 101. Next, the decoder 201 decodes this refresh control signal and sets one of the magnification factors, such as ×1, ×2, ×3, and ×4 shown in FIG. 4. The decoder 201 outputs the selected one refcnt 2 into the self refresh period counter 21.

The oscillation circuit 30 incorporated in the self refresh period counter 21 is an oscillator for oscillating a signal of 10 msec, for example.

As has been described in the first embodiment, in the self refresh period counter 21 shown in FIG. 5, an oscillation output signal, whose period is 10 msec, transferred from the oscillation circuit 30 is provided to the incrementing circuits (FA1, FA2, FA3, and FA4) 31 to 34, each is a one bit counter, in order to count it up. For example, the period of the output signal provided from each of the incrementing circuits (FA1 to FA4) 31 to 34 is FO1, FO2, FO3, and FO4, respectively. The output signal FO1 has the period of 10 msec, the output signal FO2 has the period of 20 msec, the output signal FO3 has the period of 40 msec, and the output signal FO4 has the period of 80 msec.

The selector 35 inputs the magnification factor control signal refcnt 2 transferred from the decoder 201 and then selects one of the output signals FO1 to FO4 provided from the it incrementing circuits (FA1 to FA4) 31 to 34 of one bit based on the received the magnification factor control signal refcnt.

When the magnification control signal refcnt is ×1 (refcnt 2=×1), the selector 35 selects the output signal FO1, when the magnification control signal refcnt is ×2 (refcnt 2=×2), the selector 35 selects the output signal FO2, when the magnification control signal refcnt is ×3 (refcnt 2=×3), the selector 35 selects the output signal FO3, and when the magnification control signal refcnt is ×4 (refcnt 2=×4), the selector 35 selects the output signal FO4.

In the explanation of the second embodiment, because the magnification control signal refcnt 2 indicates the magnification of ×2, the selector 35 selects the output signal FO2, so that the selector 35 outputs the self cycle signal (self cycle) of the period of 20 msec to the address generation counter 22. In addition, this self cycle signal (self cycle) is also provided to external devices (omitted from the drawings) through the self cycle control pin 100. Thus, it is possible to easily detect the period of the self refresh operation externally, because this self cycle signal (self cycle) may be transferred to the external devices through the self cycle control pin 100.

The row address buffer 8 selects the row address transferred from the read/write control circuit 301 during the normal operation mode, namely when the control signal CNT12=1, and outputs the selected row address to the row decoder 9.

On the other hand, during the self refresh operation mode, namely when the control signal CNT2=0, the address generation counter 22 in the row address buffer 8 performs the incrementing operation according to the self cycle signal (self cycle) of the period of 20 msec provided from the self refresh control circuit 71 as a trigger signal, and then the address selector 23 selects the address generated by the address generation counter 22 and outputs the selected address into the row decoder 9.

In the DRAM according to the second embodiment, during the self refresh operation mode, namely when the control signal CNT2 is zero (CNT2=0), the address generated by the address generation counter 22 in the row address buffer 8 is output to the row decoder 9. The row decoder 9 receives this row address from the row address buffer 8 and decodes the received row address. Thereby, the memory cell in the memory cell array 10 corresponding to the decoded address is accessed. The data stored in the accessed memory cell is amplified by the sense amplifier in the sense amplifier/write driver 6 and also written into the same memory cell again. The self refresh operation for the memory cell is thereby completed. The same operation is performed for each of all memory cells, repeatedly. During the test operation mode, the accessed data stored in the memory cell is provided into the data bus through the data output buffer 1.

In addition, when the self refresh operation is performed during the test operation mode in the DRAM having the self refresh control circuit of the second embodiment, the read/write control circuit 301 transmits an enable signal into both the column decoder 5 and the data output buffer 1. Thereby, the external device (omitted from the drawings) reads data from the data output buffer 1 and detects the period of the self refresh operation based on the period of the data in order to set an optimum period of the self refresh operation.

Although the setting of the self refresh period for the self refresh control register 20 in the DRAM of the second embodiment has been explained, it is possible to set the optimum period of the self refresh for the DRAM during the normal operation mode by melting and cutting fuses in a fuse circuit (omitted from the drawings) incorporated in the self refresh period counter 21 by using a laser beam, for example, after the optimum period has been detected after the completion of the test mode.

The concept of the present invention is not limited by setting the period of the self refresh operation for DRAM devices described above, for example, it is also possible to apply an auto refresh operation for Column Before Refresh (CBR) operation.

In addition, although the self cycle signal (self cycle) is generated based on the magnification control signal (refcnt 2) that is obtained by decoding a self refresh control signal stored in the decoder 201 in the self refresh control circuit 71 in the explanation of the second embodiment described above, the present invention is not limited by this, for example, it is possible to change the period of the self refresh operation based on the self cycle signal (self cycle), transferred from external devices (not shown), received by the row address buffer 8 through the self cycle control pin 100.

Furthermore, only the single DRAM is used as a memory in the explanation of the second embodiment described above, but the present invention is not limited by this configuration, it is also possible to apply the concept of the present invention to a system LSI 200 in which a microcomputer 201 and a DRAM 300 are combined (FIG. 8) or a ASIC device and a DRAM device or a plurality of DRAM devices are combined.

As described above, according to the second embodiment, the decoder 201 is incorporated in the self refresh address control section 111, and the refresh control signal is decoded by the decoder 201 so that the self refresh operation may be performed easily, and the self refresh operation is performed in various periods. Because it is thereby possible to detect the states of the DRAM under the various periods of the self refresh through the self cycle control pin 100, it is possible to set the period of the self refresh into the optimum period.

In addition, because the optimum period is set for the DRAM, it is possible to reduce the power consumption of the DRAM. Furthermore, because the read/write control circuit 301 may set the column system including the column decoder 5 into a disable state during the self refresh operation, and also may set the column system into an enable state during the self refresh operation during the test mode, it is possible to reduce the power consumption of the DRAM during the self refresh operation in the normal operation mode.

As described above in detail, according to the present invention, since the Dynamic Random Access Memory incorporates the self refresh control circuit and operators may set a desired period for a self refresh operation optionally, the present invention has an effect that it is possible to easily set any desired periods and also to set the optimum period of the self refresh operation for the memory cell array in the DRAM. Furthermore, since the DRAM according to the present invention may perform the self refresh operation at various periods that have been set and operators may detect the period of the self refresh operation through the self cycle pin externally and accurately, the present invention has an effect that it is possible to set the optimum period of the self refresh operation. Moreover, since the optimum period for the self refresh operation for the DRAM may be set, it is possible to reduce the power consumption of the DRAM.

In addition, according to the present invention, since the self refresh control circuit is incorporated in the self refresh address control section and the refresh control signal for optionally setting the period of the self refresh operation may be transferred from external devices into the self refresh control register or the decoder incorporated in the self refresh control circuit, the present invention has an effect that it is possible to set the desired period of the self refresh operation for the DRAM, to perform the test of the DRAM under the self refresh operations of the various periods, and to set the optimum period of the self refresh operation. Furthermore, since the DRAM according to the present invention may perform the self refresh operation at the various periods that have been set and operators may externally and accurately detect the period of the self refresh operation through the self cycle pin, the present invention has an effect that it is possible to set the optimum period of the self refresh operation. Moreover, since the optimum period for the self refresh operation for the DRAM may be set, it is possible to reduce the power consumption of the DRAM.

In addition, according to the present invention, since the self refresh control circuit is incorporated in the self refresh address control section for inputting the refresh control signal that is transferred externally in order to set any desired period of the self refresh operation optionally, and since the read/write control circuit sets the column system such as the column decoder and the like during the self refresh operation in the normal operation mode into the disable state, and during the self refresh operation in the testing mode into the enable state, the present invention has the effect that it is possible to easily set any desired period of the self refresh operation for the DRAM by using data provided from the memory cell array through the data output buffer (, namely, this data from the memory cell array may be provided by using the following manner. The read/write control circuit outputs a read enable control signal to both the column decoder and the data output buffer during the test operation mode.). Furthermore, since the DRAM according to the present invention may perform the self refresh operation at the various periods under the test operation mode that have been set and the present invention has an effect that it is possible to set the optimum period of the self refresh operation and to reduce the power consumption of the DRAM.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A dynamic random access memory incorporating a self refresh control circuit comprising:

a memory cell array comprising a plurality of memory cells; and a self refresh address control section for setting a period of a self refresh operation for said memory cell array having said plurality of memory cells and for providing an address signal to said memory cell array in order to perform said self refresh operation for said memory cell array, and said self refresh address control section comprising: a self refresh control circuit for inputting a control signal to optionally set a period of the self refresh operation and for setting a period of an address signal of the self refresh operation based on the received control signal, and for outputting a self cycle signal of the period that has been set; and a row address buffer for inputting the self cycle signal that has been set by said self refresh control circuit, and for outputting the address signal to said memory cell array based on the self cycle signal as a trigger signal.

2. A dynamic random access memory incorporating a self refresh control circuit as claimed in claim 1, wherein said self refresh control circuit comprises: a refresh control register; and a self refresh period counter, wherein said self refresh control register inputs a control signal to optionally specify a period of the self refresh operation for said memory cell array, outputs a magnification control signal indicating the period of the address signal for the self refresh operation based on the control signal to optionally specify the period of the self refresh operation, and wherein said self refresh period counter inputs the magnification control signal, generates a self cycle signal, and outputs the generated self cycle signal to said row address buffer.

3. A dynamic random access memory incorporating a self refresh control circuit as claimed in claim 1, wherein said self refresh control circuit comprises: a decoder and a self refresh period counter, wherein said decoder inputs a control signal to optionally specify a period of the self refresh operation, decoding the control signal in order to generate and output a magnification control signal indicating the period of the self refresh operation based on the control signal to optionally specify the period of the self refresh operation, and wherein said self refresh period counter inputs the magnification control signal, generates a self cycle signal, and outputs the generated self cycle signal to said row address buffer.

4. A dynamic random access memory incorporating a self refresh control circuit as claimed in claim 1, further comprising a self cycle control pin in order to provide the self cycle signal, to be transferred from said self refresh control circuit to said row address buffer, into external devices, and wherein said self cycle signal is transferred to said external devices through said self cycle control pin to control the period of the self refresh operation.

5. A dynamic random access memory incorporating a self refresh control circuit as claimed in claim 2, further comprising a self cycle control pin in order to provide the self cycle signal, to be transferred from said self refresh control circuit to said row address buffer, into external devices, and wherein said self cycle signal is transferred to said external devices through said self cycle control pin to control the period of the self refresh operation.

6. A dynamic random access memory incorporating a self refresh control circuit as claimed in claim 3, further comprising a self cycle control pin in order to provide the self cycle signal, to be transferred from said self refresh control circuit to said row address buffer, into external devices, and wherein said self cycle signal is transferred to said external devices through said self cycle control pin to control the period of the self refresh operation.

7. A dynamic random access memory incorporating a self refresh control circuit as claimed in claim 1, further comprising a read/write control circuit for transferring an enable signal to a column decoder and a data output buffer during the self refresh operation in order to operate said column decoder and said data output buffer, and wherein data items stored in said memory cell array are transferred to external devices based on the period of the self refresh operation that has been set by said self refresh control circuit.

8. A dynamic random access memory incorporating a self refresh control circuit as claimed in claim 2, further comprising a read/write control circuit for transferring an enable signal to a column decoder and a data output buffer during the self refresh operation in order to operate said column decoder and said data output buffer, and wherein data items stored in said memory cell array are transferred to external devices based on the period of the self refresh operation that has been set by said self refresh control circuit.

9. A dynamic random access memory incorporating a self refresh control circuit as claimed in claim 3, further comprising a read/write control circuit for transferring an enable signal to a column decoder and a data output buffer during the self refresh operation in order to operate said column decoder and said data output buffer, and wherein data items stored in said memory cell array are transferred to external devices based on the period of the self refresh operation that has been set by said self refresh control circuit.

10. A system LSI comprising: said dynamic random access memory as claimed in claim 1; and a system for inputting data items from said DRAM and outputting data items to said DRAM, and processing the data items.

11. A system LSI comprising: said dynamic random access memory as claimed in claim 2; and a system for inputting data items from said DRAM and outputting data items to said DRAM, and processing the data items.

12. A system LSI comprising: said dynamic random access memory as claimed in claim 3; and a system for inputting data items from said DRAM and outputting data items to said DRAM, and processing the data items.

13. A system LSI comprising: said dynamic random access memory as claimed in claim 4; and a system for inputting data items from said DRAM and outputting data items to said DRAM, and processing the data items.

14. A system LSI comprising: said dynamic random access memory as claimed in claim 7; and a system for inputting data items from said DRAM and outputting data items to said DRAM, and processing the data items.

* * * * *